United States Patent [19]
Yamasaki

[11] Patent Number: 6,146,957
[45] Date of Patent: *Nov. 14, 2000

[54] METHOD OF MANUFACTURING A SEMICONDUCTOR DEVICE HAVING A BURIED REGION WITH HIGHER IMPURITY CONCENTRATION

[75] Inventor: Youichi Yamasaki, Kagoshima, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/052,082

[22] Filed: Mar. 31, 1998

[30] Foreign Application Priority Data

Apr. 1, 1997 [JP] Japan .................. P09-098515

[51] Int. Cl.[7] .............................. H01L 21/8228
[52] U.S. Cl. ...................... 438/326; 438/328; 438/57; 438/357; 438/358; 257/439; 257/464; 257/450; 257/452
[58] Field of Search ................... 257/461, 452, 257/457, 439, 436, 446, 450, 463, 464; 438/357, 358, 326, 328, 57

[56] References Cited

U.S. PATENT DOCUMENTS

| | | | |
|---|---|---|---|
| 4,089,021 | 5/1978 | Sato et al. ................. | 357/20 |
| 5,252,851 | 10/1993 | Mita et al. ................. | 257/446 |
| 5,283,460 | 2/1994 | Mita ........................... | 257/432 |
| 5,300,451 | 4/1994 | Zambrano ................. | 438/234 |
| 5,418,396 | 5/1995 | Mita ........................... | 257/461 |
| 5,500,550 | 3/1996 | Morishita ................... | 257/461 |
| 5,770,872 | 6/1998 | Arai ........................... | 257/257 |
| 5,898,196 | 4/1999 | Hook et al. ............... | 257/292 |

FOREIGN PATENT DOCUMENTS

| | | | |
|---|---|---|---|
| 501316-A2 | 9/1992 | European Pat. Off. ......... | 257/46 |
| 4-240780 | 8/1992 | Japan ............................. | 257/461 |

*Primary Examiner*—David Hardy
*Assistant Examiner*—N. Drew Richards
*Attorney, Agent, or Firm*—Ronald P. Kananen; Rader, Fishman & Grauer

[57] ABSTRACT

Since the PN junction of a photodiode is formed of a silicon substrate having a low impurity concentration and an epitaxial layer, the width of the depletion layer in the PN junction is formed wider, the parasitic capacitance by the junction capacitance is lowered, and the diffusion length of the silicon substrate is formed longer. Besides, a buried layer containing a high impurity concentration is formed by a high energy ion implantation method in such a depth that the buried layer cannot be depleted by a reverse voltage applied to the PN junction, which is served as a region to lead out the anode, which accordingly results in a low parasitic resistance at the anode. Thereby, the invention provides a semiconductor device including a photodetector and a method of manufacturing the same that achieves a high photoelectric conversion sensitivity and an excellent frequency characteristic at the same time.

11 Claims, 8 Drawing Sheets

METHOD OF MANUFACTURING A SEMICONDUCTOR DEVICE HAVING A BURIED REGION WITH HIGHER IMPURITY CONCENTRATION

BACKGROUND OF THE INVENTION

1. Field of the Invention

The present invention relates to a semiconductor device including a photodetector having the PN junction and a method of manufacturing the same.

2. Description of Related Art

FIG. 7 illustrates a first conventional example of a semiconductor device including a photodiode and an NPN transistor. In this first conventional example, an N type buried layer 12 as the buried collector of the NPN transistor and a P type buried layer 13 as the anode of the photodiode and the device isolation layer are formed on a P type silicon substrate 11. The impurity concentration of the buried layer 13 is approximately $10^{19}$ atom/cm$^3$.

On the silicon substrate 11 is formed an N⁻type epitaxial layer 14 as the cathode of the photodiode and the intrinsic collector of the NPN transistor. On the epitaxial layer 14 and the silicon substrate 11 are formed a P type diffusion layer 15 as a plug for the anode of the photodiode and the device isolation and an N type diffusion layer 16 as a plug for the collector of the NPN transistor. Thus, the buried layer 13 and the epitaxial layer 14 form the PN junction of the photodiode.

The resistivity of the epitaxial layer 14 is 1 ohm-cm and the thickness thereof is about 1–4 mm. In the epitaxial layer 14 is formed a P type diffusion layer 17 as the intrinsic base of the NPN transistor. In the diffusion layers 15, 17 is formed a P⁺ type diffusion layer 18 as a contact area for the anode plug of the photodiode and a graft base of the NPN transistor.

In the epitaxial layer 14 and the diffusion layers 16, 17 is formed an N⁺ type diffusion layer 19 as the cathode of the photodiode, a contact area for the collector plug of the NPN transistor, and the emitter thereof. The surface of the epitaxial layer 14 is overlaid with an insulating film 21.

The insulating film 21 is provided with contact holes 22 reaching the diffusion layers 18, 19, and a metal interconnecting layer 23 is connected to the diffusion layers 18, 19 through the contact holes. The metal interconnecting layer 23, etc., are over laid with an interlayer film 24. A metal interconnecting layer 25 also functioning as a shading film for the photodiode is patterned on the interlayer film 24. And, the metal interconnecting layer 25 is overlaid with a protective film 26. Thus, a photodiode 27 and an NPN transistor 28 are formed.

FIG. 8 illustrates a second conventional example of a semiconductor device including a photodiode and an NPN transistor. In this second conventional example, the P type buried layer 13 is used only for the device isolation layer, and it is not used for the anode of the photodiode. And, except that the P type silicon layer 11 is used as the anode of the photodiode 27, the second conventional example possesses the substantially same construction as the first conventional example shown in FIG. 7.

In the photodiode 27 in the semiconductor device of the first conventional example shown in FIG. 7, the buried layer 13 having a high impurity concentration is served as the anode, and therefore, the parasitic resistance of the anode is made low and the frequency characteristic becomes excellent. However, since the impurity concentration of the buried layer 13 is high, the width of the depletion layer in the PN junction is narrow, and the diffusion length in the buried layer 13 is short, which leads to a low photoelectric conversion sensitivity.

On the other hand, the wavelength of a semiconductor laser used as the light source in the optical disk recording and reproducing devices such as a compact disc player and minidisc player, is generally 780 nm. The absorption length of the light of this wavelength in the silicon is 9–10 μm. On the other hand, the thickness of the epitaxial layer 14 for forming bipolar elements such as the NPN transistor 28 and the like is about 1–4 μm, as already mentioned.

Therefore, the buried layer 13 is formed at a shallow position, in comparison to the absorption length of the light whose wavelength is 780 nm, and there are great many electron-hole pairs generated by the light absorbed in this buried layer 13. However, the diffusion length in the buried layer 13 is short, and most of the generated electron-hole pairs are recombined in the buried layer 13. Therefore, in the photodiode 27 in the semiconductor device of the first conventional example, the photoelectric conversion sensitivity becomes low as mentioned above.

On the other hand, in the photodiode 27 in the semiconductor device of the second conventional example shown in FIG. 8, the silicon substrate 11 is served as the anode, and this silicon substrate 11 and the epitaxial layer 14 form the PN junction, and the silicon substrate 11 gives a lower impurity concentration than the buried layer 13. Therefore, the width of the depletion layer in the PN junction is wider, and the diffusion length in the silicon substrate 11 is longer, which produces a higher light detection sensitivity. However, the parasitic resistance of the anode formed of the silicon substrate 11 is high, which leads to an inferior frequency characteristic.

In other words, any of the photodiodes 27 in the semiconductor devices in the first and second conventional examples shown in FIG. 7 and 8 cannot have achieved both a high photoelectric conversion sensitivity and an excellent frequency characteristic at the same time.

SUMMARY OF THE INVENTION

The present invention has been made in view of the foregoing problem, and an object of the present invention is to provide a semiconductor device including a photodetector that can achieve both a high photoelectric conversion sensitivity and an excellent frequency characteristic at the same time, and a method of manufacturing the same.

The semiconductor device according to the present invention relates to a semiconductor device including a photodetector having a PN junction formed of a first semiconductor region of a first conductive type and a second semiconductor region of a second conductive type which overlies said first semiconductor region. In the semiconductor device, a third semiconductor region of the first conductive type containing a higher impurity concentration than the first semiconductor region is buried in a region that is not depleted by a reverse voltage applied to the PN junction, and the third semiconductor region is served as a region to lead out one electrode of the photodetector.

According to another aspect of the invention, the semiconductor device may be constructed such that a fourth semiconductor region of the first conductive type containing a higher impurity concentration than the first semiconductor region surrounds a device active region, the third semiconductor region comes into contact with a lower end of the fourth semiconductor region, and a fifth semiconductor region of the first conductive type containing a higher impurity concentration than the first semiconductor region comes into contact with a lower end of the third semiconductor region, and occludes the bottom of the device active region.

Further, the semiconductor device according to the invention may contain a bipolar device formed in the device active region.

Further, in the semiconductor device according to the invention, a semiconductor substrate may be used as the first semiconductor region, and an epitaxial layer overlying the semiconductor substrate may be used as the second semiconductor region.

The method of manufacturing a semiconductor device according to the invention, including a photodetector having a PN junction formed of a first semiconductor region of a first conductive type and a second semiconductor region of a second conductive type which overlies said first semiconductor region, comprises the steps of burying, by a high energy ion implantation method, a third semiconductor region of the first conductive type containing a higher impurity concentration than the first semiconductor region in a region inside of the first semiconductor region that is not depleted by a reverse voltage applied to the PN junction, and forming the third semiconductor region as a region to lead out one electrode of the photodetector.

In the semiconductor device according to the invention, the third semiconductor region containing a higher impurity concentration than the first semiconductor region is buried in the first semiconductor region, which is a region that is not depleted by a reverse voltage applied to the PN junction of a photodetector.

Accordingly, the width of the depletion layer in the PN junction is formed wider, the number of carriers generated inside the depletion layer is increased, and the parasitic capacitance by the junction capacitance is decreased. In addition, the diffusion length of the first semiconductor region is formed longer, and the number of carriers reaching the depletion layer by the diffusion of the carriers generated outside of the depletion layer is increased.

Moreover, since the third semiconductor region containing a higher impurity concentration than the first semiconductor region is served as a region to lead out one electrode of the photodetector, the parasitic resistance at the one electrode is lowered.

Further, the third through fifth semiconductor regions of the first conductive type containing a higher impurity concentration than the first semiconductor region occlude the side and bottom of the device active region, and if the impurity concentration of the first semiconductor region is low, the device isolation in the device active region can be performed in the third through fifth semiconductor regions.

Accordingly, the width of the depletion layer in the PN junction is formed still wider, the number of carriers generated inside the depletion layer is further increased, and the parasitic capacitance by the junction capacitance is further decreased. In addition, the diffusion length of the first semiconductor region is formed still longer, and the number of carriers reaching the depletion layer by the diffusion, of the carriers generated outside of the depletion layer is further increased.

Moreover, the fifth semiconductor region coming into contact with a lower end of the third semiconductor region occludes the bottom of the device active region, which secures a deep device active region compared to a structure that the third semiconductor region directly occludes the bottom of the device active region.

Further, although a bipolar device is formed in the device active region and a buried collector is provided inside of the device active region, since the device active region is located in a deep position, the fifth semiconductor region having a high impurity concentration can be separated from the buried collector, thereby reducing the parasitic capacitance at the buried collector.

In the method of manufacturing a semiconductor device according to the invention, the third semiconductor region is formed in a region inside of the first semiconductor region that is not depleted by a reverse voltage applied to the PN junction of a photodetector. However, since the third semiconductor region is formed by a high energy ion implantation method, the third semiconductor region can easily be formed in a desired depth inside of the first semiconductor region.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Incidentally, the performance of a photodiode is determined by the photoelectric conversion sensitivity and the frequency characteristic. Here, the photoelectric conversion sensitivity is determined by the number of the carriers generated in the depletion layer in the PN junction and the number of the carriers that reach the depletion layer by diffusion of the carriers generated outside the depletion layer.

In view of this point, widening the width of the depletion layer and to elongate the diffusion length in the semiconductor region on both sides of the depletion layer, namely, to decreasing the recombination will enhance the photoelectric conversion sensitivity. And, to widening the width of the depletion layer and to elongate the diffusion length in the semiconductor region on both sides of the depletion layer, namely, decreasing the recombination will be achieved by lowering the impurity concentration in the P type and N type semiconductor regions forming the photodiode.

On the other hand, the frequency characteristic of the photodiode is determined by the parasitic capacitance and parasitic resistance. Reducing the parasitic capacitance can be done by widening the width of the depletion layer in the PN junction, which can be achieved by lowering the impurity concentration in the P type and N type semiconductor regions forming the photodiode. Further, reducing the parasitic resistance can be achieved by increasing the impurity concentration in the P type and N type semiconductor regions forming the photodiode.

Figure 1:
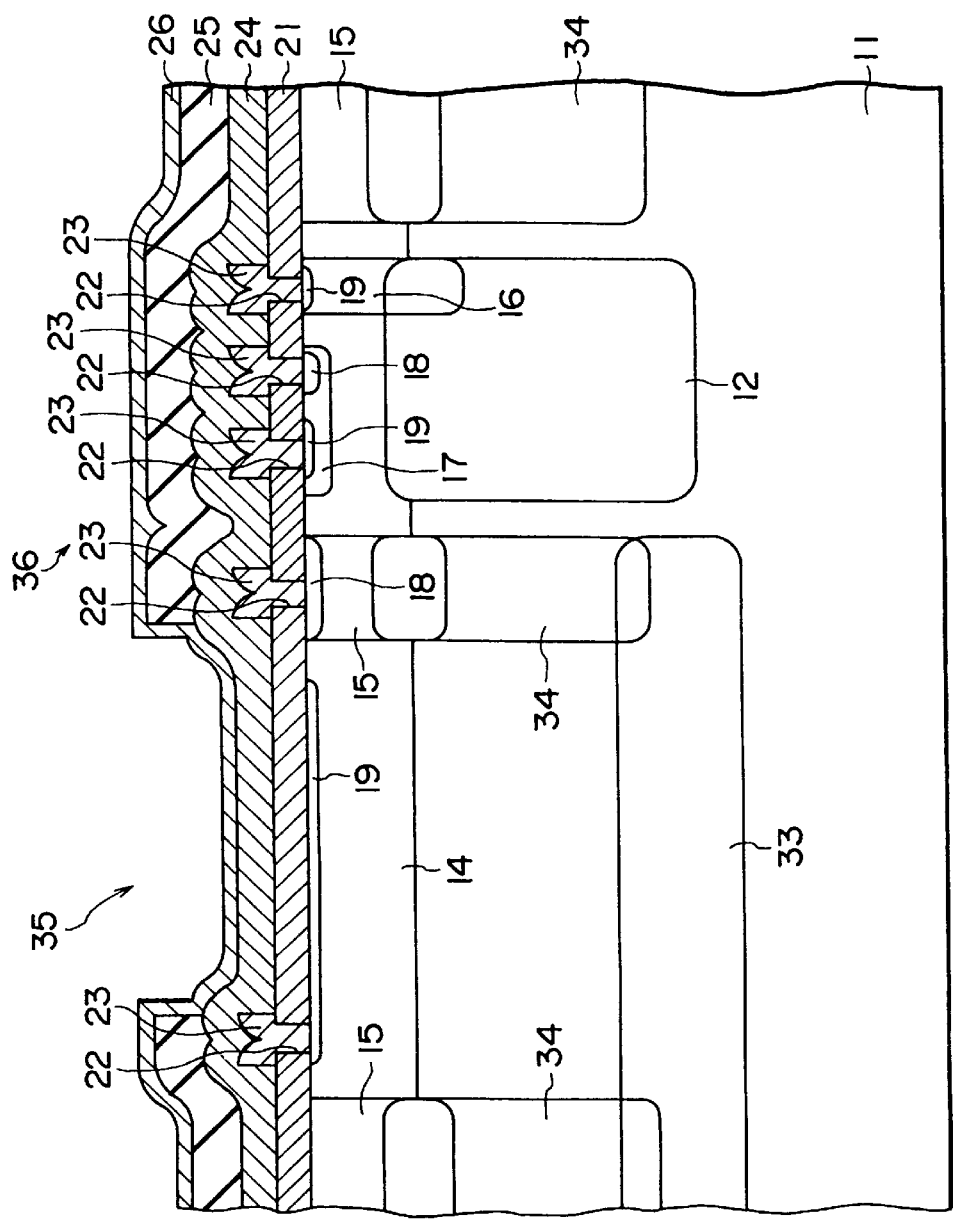
FIG. 1 is a side sectional view of the first embodiment according to the present invention.
Figure 2:
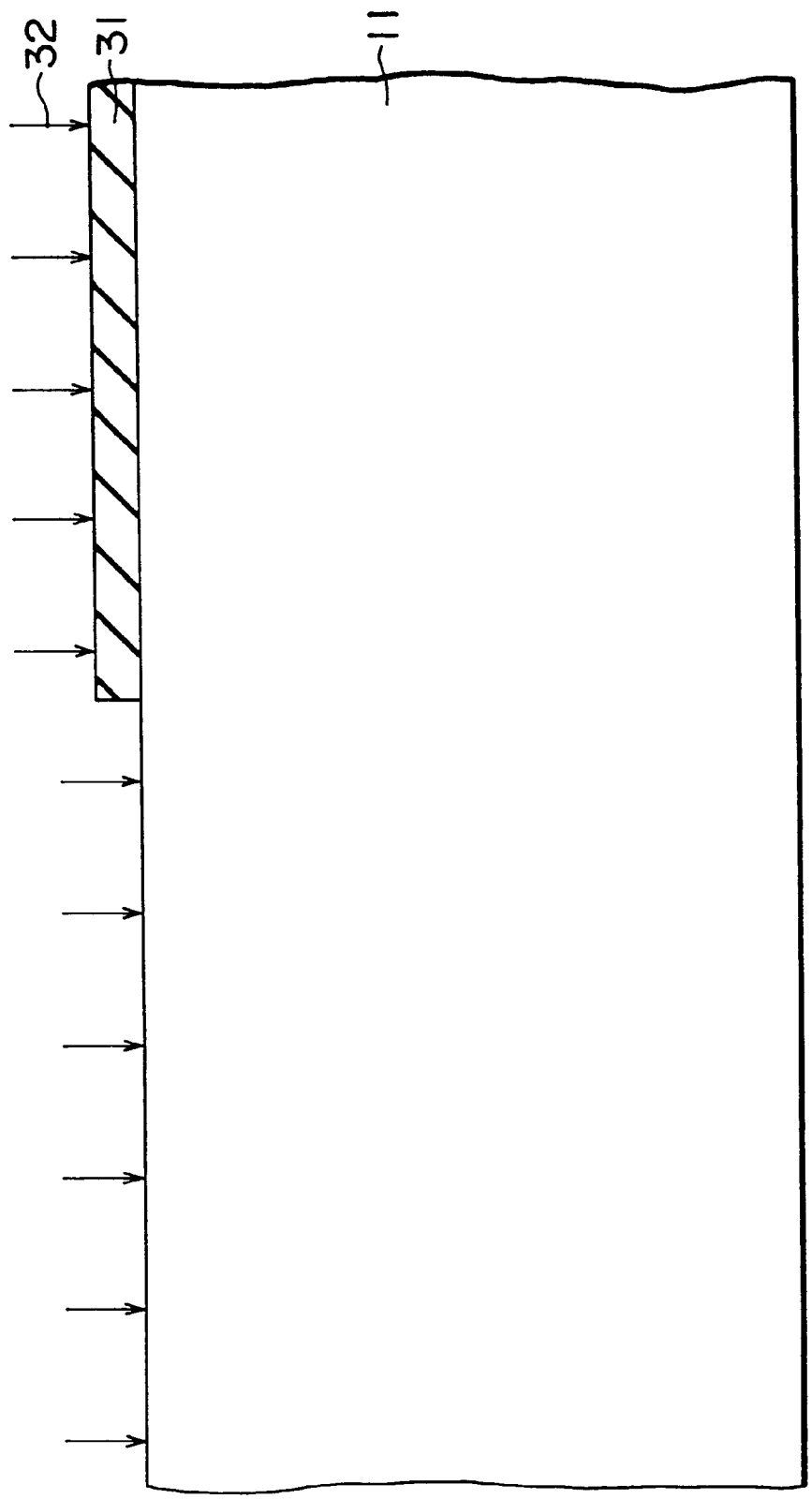
FIG. 2 is a side sectional view to illustrate a first process in the manufacturing method of the first embodiment.

Hereafter, the first and second embodiments of the present invention will be described with reference to FIG. 1 through 6, in which the invention is applied to a semiconductor device including a photodiode and an NPN transistor. FIG. 1 illustrates a semiconductor device relating to the first embodiment. In order to manufacture the semiconductor, as shown in FIG. 2, an oxide film 31 with the thickness of about 85 nm is formed on a P type silicon substrate 11 of which resistivity is about 4 ohm-cm.

The silicon substrate 11 is served as the anode of the photodiode, and the oxide film 31 on the region where the photodiode is formed is selectively removed. Using the oxide film 31 as the mask, ions of boron 32 are implanted into the silicon substrate 11 with a highly accelerated energy of about 2–10 MeV and a dose rate of $1.0 \times 10^{12}$ ion/cm$^2$.

Figure 3:
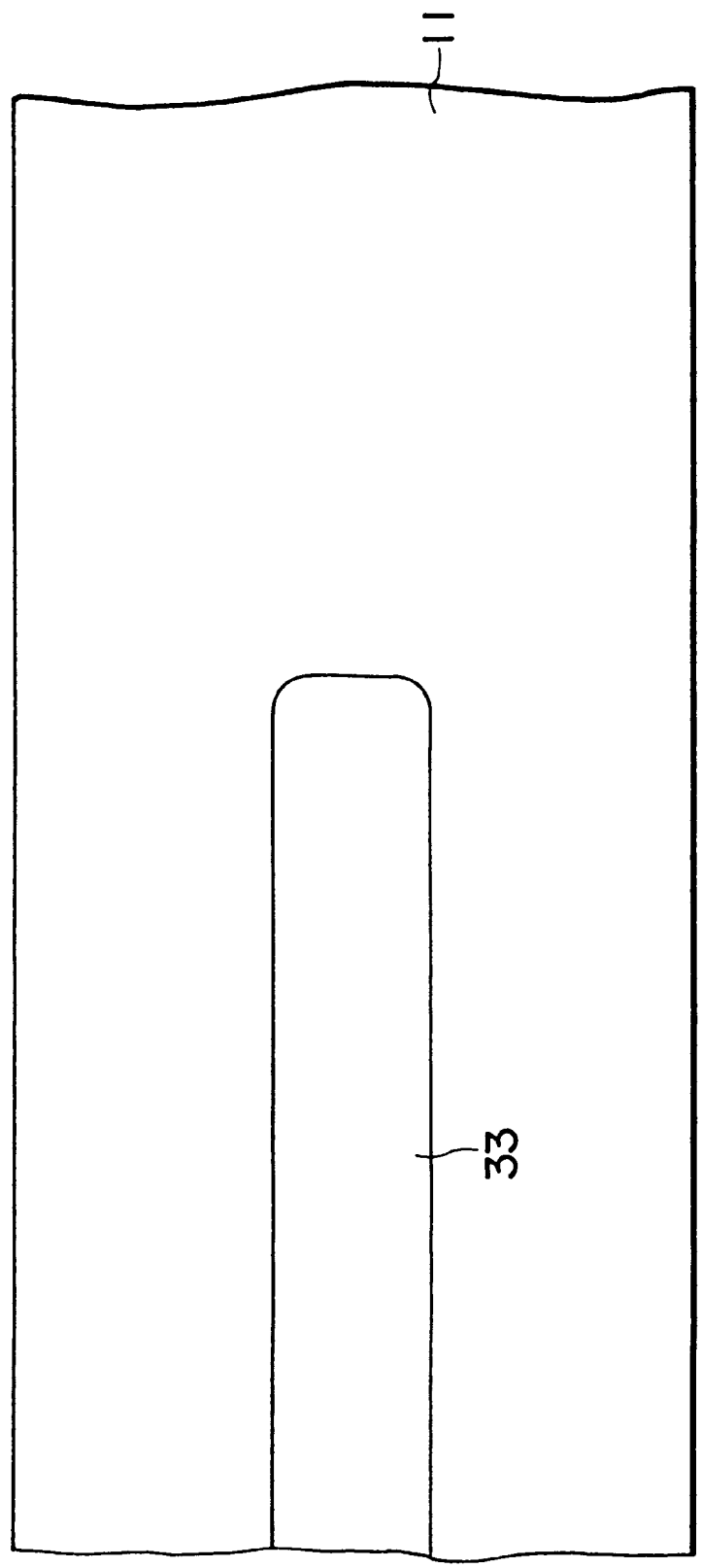
FIG. 3 is a side sectional view to illustrate a process following the process in FIG. 2.

Next, as shown in FIG. 3, after the oxide film 31 has been removed, a heat treatment for 60 minutes is carried out under 1200° C. in the atmosphere of $N_2$ to activate the ion-implanted boron 32, thereby forming a P type buried layer 33 inside of the silicon substrate 11. The buried layer 33 is served as a region to lead out the anode of the photodiode.

Figure 4:
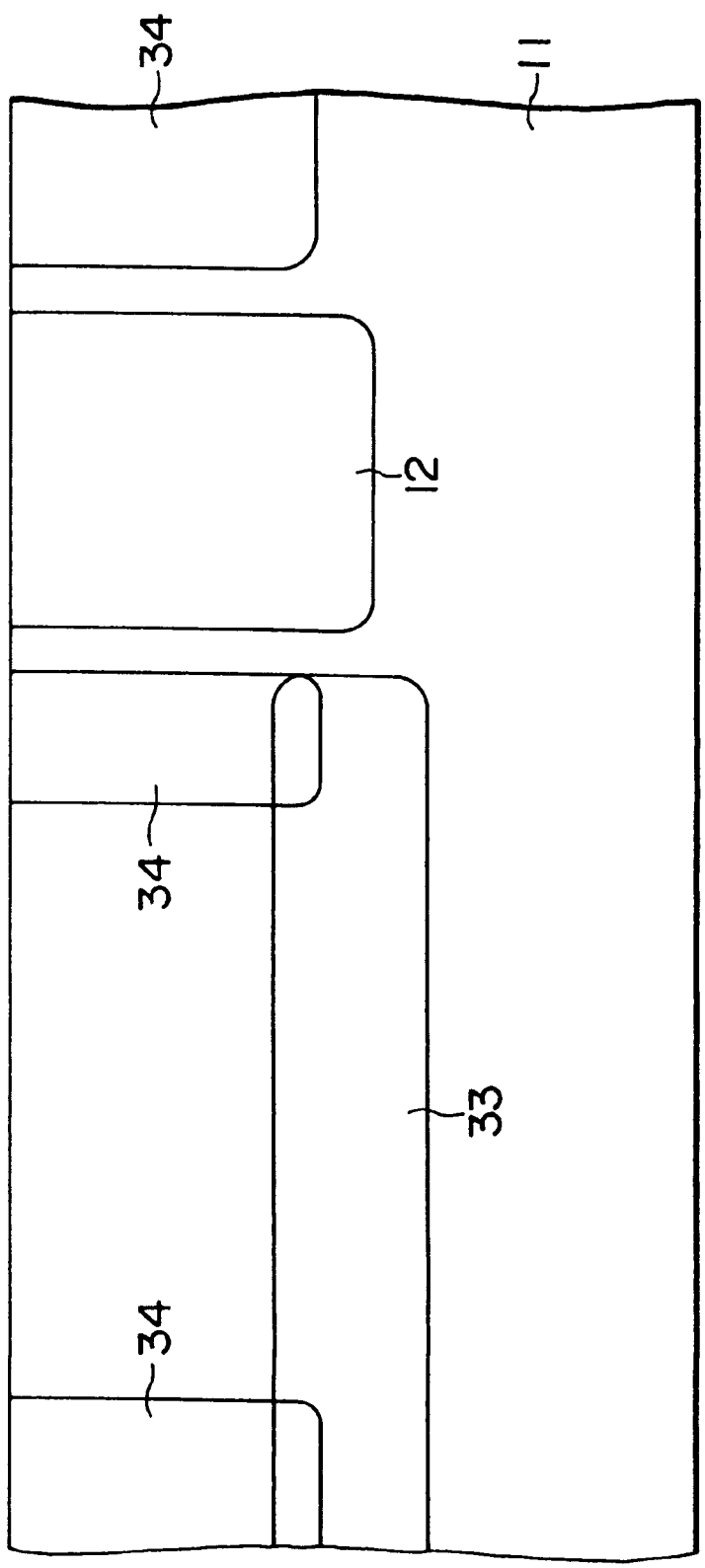
FIG. 4 is a side sectional view to illustrate a process following the process in FIG. 3.

Next, ions of phosphorous are selectively implanted into the silicon substrate 11 with an accelerated energy of 50 keV and a dose rate of $7.5 \times 10^{14}$ ion/cm$^2$. And, a heat treatment for 100 minutes is carried out under 1200° C. in the atmosphere of $N_2$ to activate the ion-implanted phosphorous. Thus, an N type buried layer 12 is formed in the silicon substrate 11 as shown in FIG. 4. The buried layer 12 is served as a buried collector of the NPN transistor.

Thereafter, ions of boron are selectively implanted into the silicon substrate 11 with an accelerated energy of 30 keV and a dose rate of $2.5 \times 10^{14}$ ion/cm$^2$. And, a heat treatment for 100 minutes is carried out under 1200° C. in the atmosphere of $N_2$. Further, in order to remove crystalline defects in the silicon substrate 11 which were made by the impact of the ion implantation, an oxidation treatment for 10 minutes is carried out in a moist $0_2$ atmosphere under 1200° C. Thereby, the ion-implanted boron is activated, and a P type buried layer 34 is formed in the silicon substrate 11.

Figure 5:
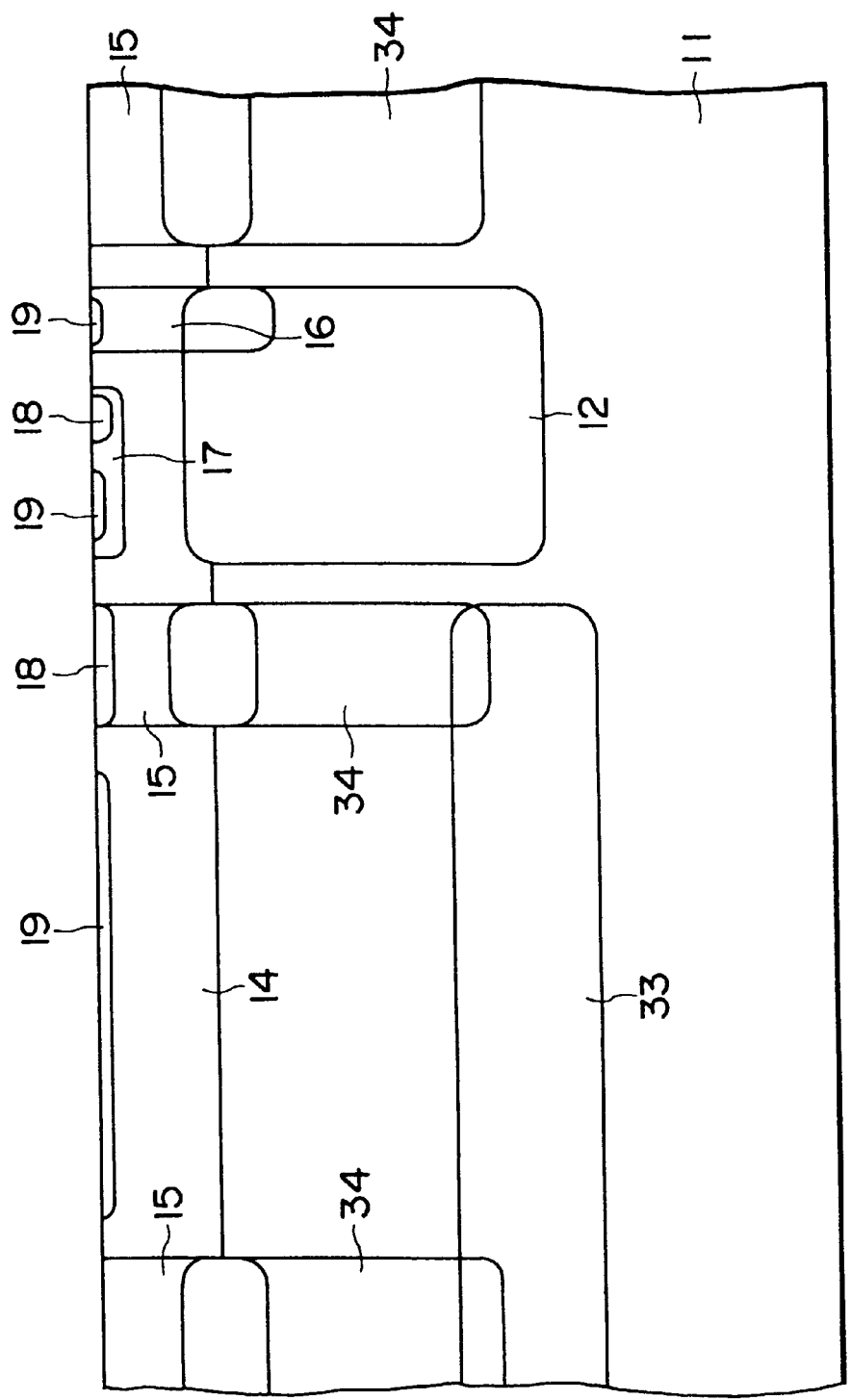
FIG. 5 is a side sectional view to illustrate a process following the process in FIG. 4.

The buried layer 34 is served as a plug for the anode of the photodiode and a device isolation layer. Thereafter, an oxide film (not illustrated) formed on the surface of the silicon substrate 11 through the foregoing oxidation treatment is removed by using a hydrofluoric acid. Next, as shown in FIG. 5, an epitaxial layer 14 of which the resistivity is 1 ohm-cm and the thickness is 4 $\mu$m is grown on the silicon substrate 11. The epitaxial layer 14 is served as the cathode of the photodiode and the intrinsic collector of the NPN transistor.

Thus, the silicon substrate 11 and the epitaxial layer 14 form the PN junction of the photodiode. Here, the buried layer 33 is formed in such a deep position that the reverse voltage applied across the PN junction does not deplete the buried layer. A slight oxide film (not illustrated) whose thickness is 20 nm is formed by the thermal oxidation method on the surface of the epitaxial layer 14.

Thereafter, ions of boron are selectively implanted into the epitaxial layer 14 and the silicon substrate 11 with an accelerated energy of 50 keV and a dose rate of $6.0 \times 10^{15}$ ion/cm$^2$, and ions of phosphorous are implanted thereinto with an accelerated energy of 70 keV and a dose rate of $1.0 \times 10^{16}$ ion/cm$^2$. And, a heat treatment for 70 minutes is carried out in the atmosphere of $N_2$ under 1100° C. Thereby, the ion-implanted boron and phosphorous are activated, and a P type diffusion layer 15 and an N type diffusion layer 16 are formed.

The diffusion layer 15 is served as a plug for the anode of the photodiode and a device isolation layer, and the diffusion layer 16 is served as a plug for the collector of the NPN transistor. Thereafter, ions of boron are selectively implanted into the epitaxial layer 14 with an accelerated energy of 50 keV and a dose rate of $1.0 \times 10^{14}$ ion/cm$^2$. A heat treatment for 30 minutes is carried out in the atmosphere of $N_2$ under 900° C.; and thereby, the ion-implanted boron is and a P type diffusion layer 17 is formed. The diffusion layer 17 is served as the intrinsic base of the NPN transistor.

Thereafter, ions of $BF_2$ are implanted into the diffusion layers 15, 17 with an accelerated energy of 50 keV and a dose rate of $1.0 \times 10^{15}$ ion/cm$^2$, by using a photo resist (not illustrated) as a mask. And, after removing the photo resist, by using another photo resist (not illustrated) as a mask, ions of arsenic are implanted into the epitaxial layer 14 and the diffusion layers 16, 17 with an accelerated energy of 50 keV and a dose rate of $5.0 \times 10^{15}$ ion/cm$^2$.

And, a heat treatment for 25 minutes is carried out in the atmosphere of $N_2$ under 1000° C.; and the ion-implanted boron and arsenic are activated, and a P$^+$ type diffusion layer 18 and a N$^+$ diffusion layer 19 are formed. The diffusion layer 18 is served as a contact region for the anode plug of the photodiode and a graft base of the NPN transistor. The diffusion layer 19 is served as the cathode of the photodiode and a contact region for the collector plug of the NPN transistor and the emitter thereof.

Next, as shown in FIG. 1, an insulating film 21 with the thickness of about 600 nm is deposited on the epitaxial layer 14 by the atmospheric CVD method, and contact holes 22 reaching the diffusion layers 18, 19 are bored through the insulating film 21 by the RIE method. And, an aluminum layer which contains a silicon of 1% and has the thickness of about 700 nm is deposited by the spattering method. The unnecessary part of the aluminum layer is etched by the RIE method to thereby form a metal interconnecting layer 23 connected to the diffusion layers 18, 19 through the contact holes 22.

Thereafter, an interlayer film 24 of a SiN film having the thickness of about 1 $\mu$m is deposited by the plasma CVD method. Contact holes (not illustrated) reaching the metal interconnecting layer 23 are bored through the interlayer film 24 by the RIE method. And, an aluminum layer containing a silicon of 1% is deposited by the spattering method. Only a part on the region where the photodiode is to be formed in this aluminum layer is selectively etched by the RIE method to form a metal interconnecting layer 25 that also serves as a shading film for the photodiode.

Thereafter, a protective film 26 of a SiN film having the thickness of about 700 nm is deposited by the plasma CVD method. Portions of the protective film 26 where bonding pads are to be formed are etched and removed by the RIE. And, a heat treatment, namely, a sintering treatment is performed in the atmosphere of a forming gas containing an $N_2$ of 95% and an $H_2$ of 5%, which completes manufacturing of the semiconductor device including a photodiode 35 and an NPN transistor 36 relating to the first embodiment.

Figure 6:
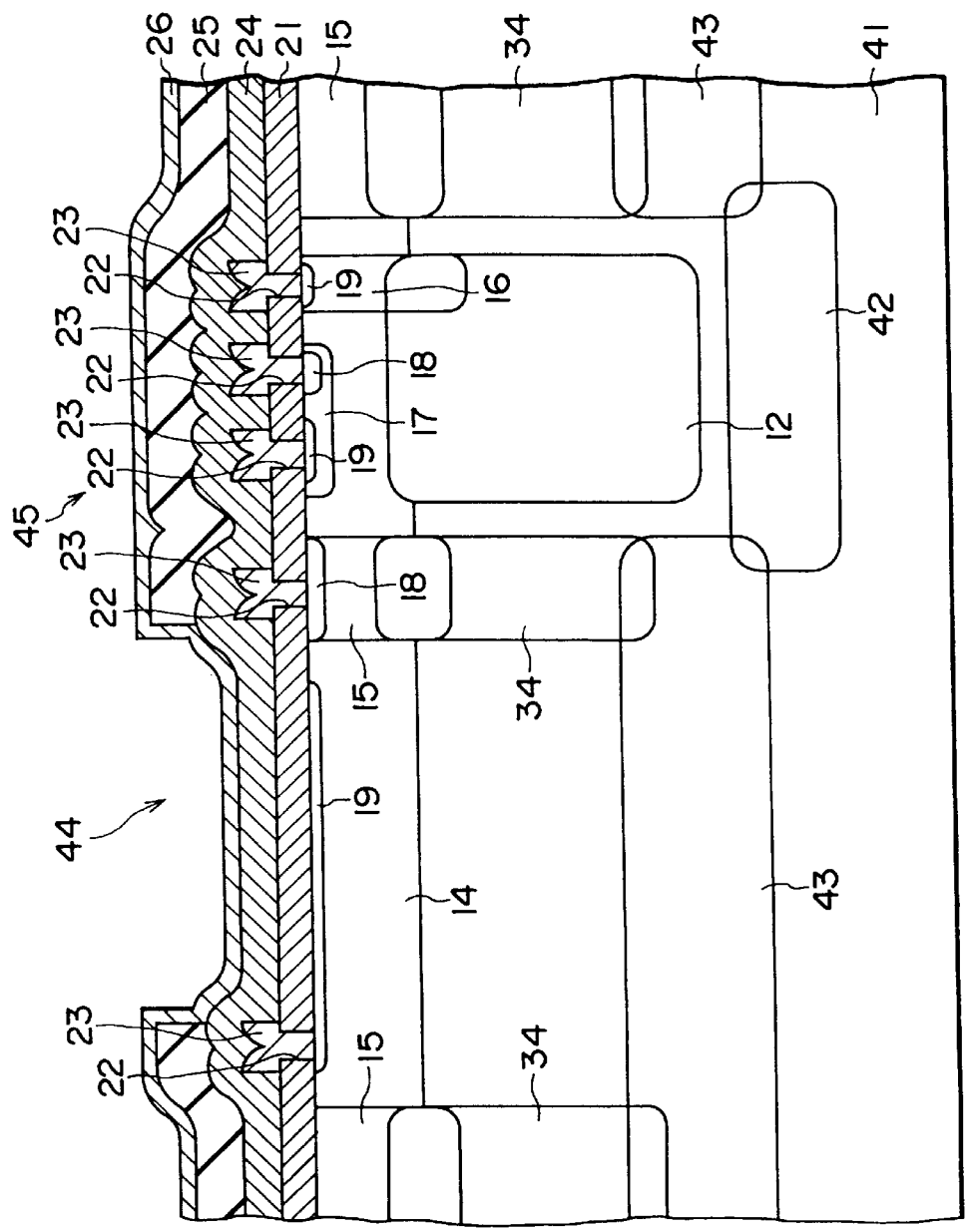
FIG. 6 is a side sectional view of the second embodiment according to the present invention.
Figure 7:
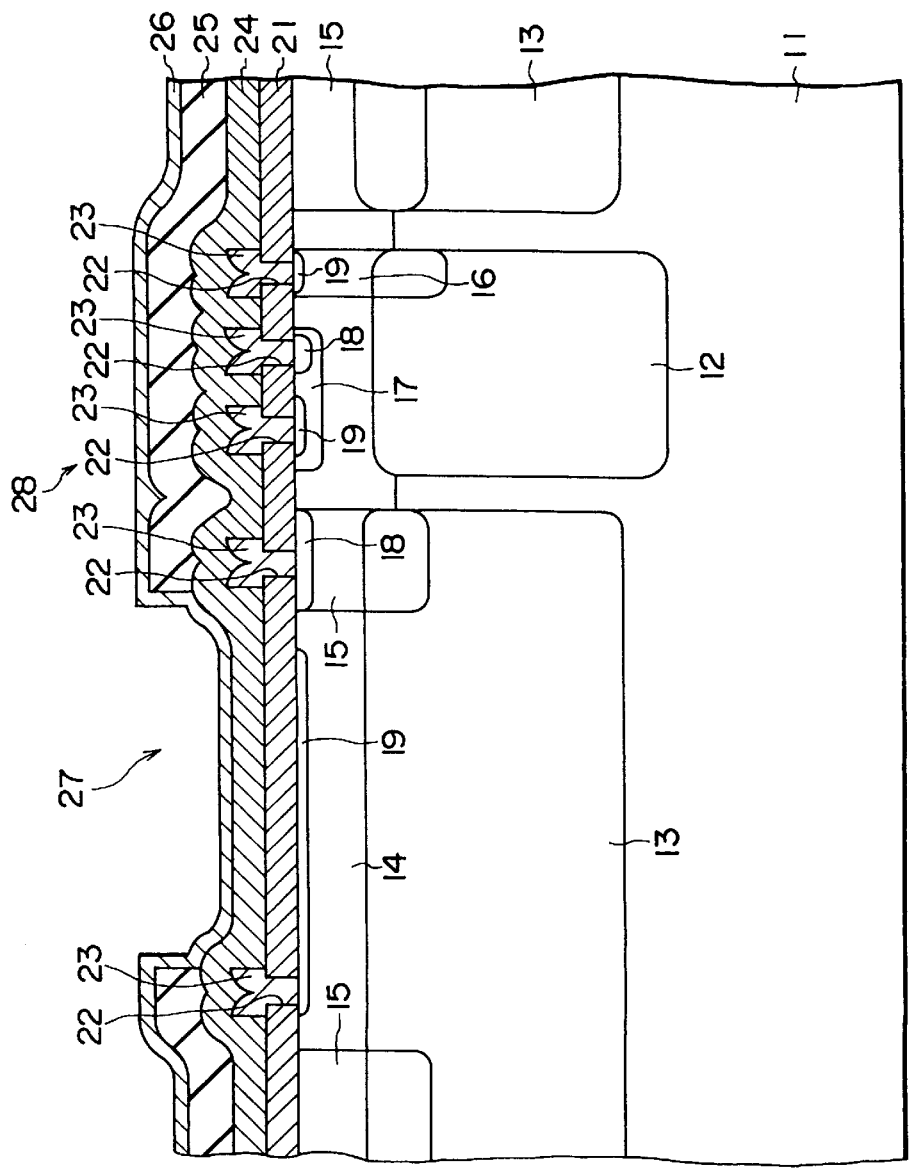
FIG. 7 is a side sectional view of the first conventional example relating to the present invention.
Figure 8:
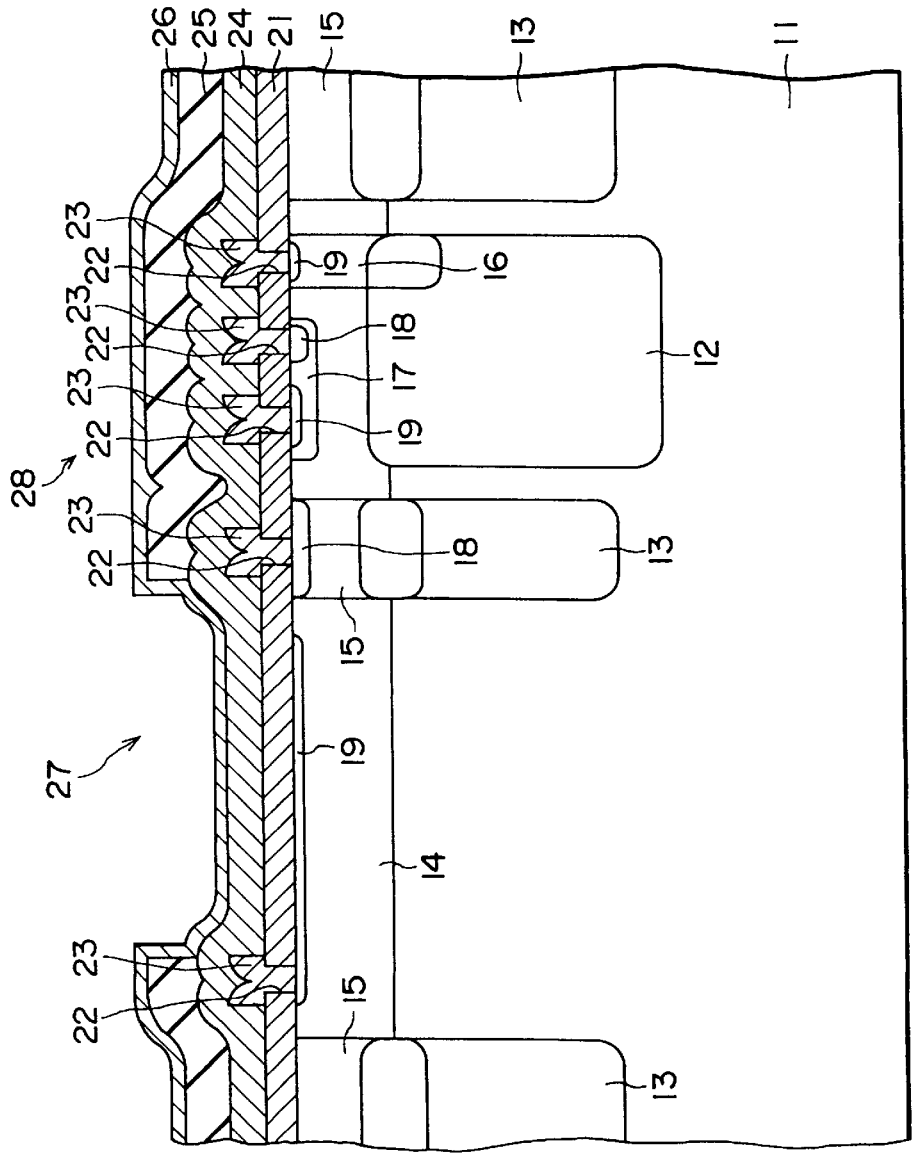
FIG. 8 is a side sectional view of the second conventional example relating to the present invention.

FIG. 6 illustrates a semiconductor device relating to the second embodiment. In order to manufacture this semiconductor, a P type silicon substrate 41 is used which has the impurity concentration lower than that of the silicon substrate 11 in the first embodiment and the resistivity of about 20 ohm-cm. Ions of boron are implanted into the region of the silicon substrate 41, except the region where the photodiode is to be formed, with a highly accelerated energy of about 5 MeV and a dose rate of $1.0 \times 10^{12}$ ion/cm$^2$.

Thereafter, the same ion implantation as the buried layer 33 in the first embodiment is formed is carried out into the region of the silicon substrate 41, except the region where the foregoing ion implantation is carried out. And, a heat treatment for 60 minutes is carried out in the atmosphere of $N_2$ under 1200° C. to activate the ion-implanted boron. As the result, inside of the silicon substrate 41, a P type buried layer 42 is formed in the region except where the photodiode is formed, and a P type buried layer 43 connected to the upper end of the buried layer 42 is formed in the other region.

Thereafter, the substantially same process as the foregoing first embodiment is carried out to finish manufacturing the semiconductor device including a photodiode 44 and an NPN transistor 45 relating to the second embodiment. In this semiconductor device, as clearly seen from FIG. 6, the device active region of the NPN transistor 45 is entirely covered with a diffusion layer 15 and buried layers 34, 42, and 43. Accordingly, the low impurity concentration of the silicon substrate 41 as in the foregoing will not give any inconveniences to the device isolation.

Further, in the second embodiment as shown in FIG. 6, a buried layer 12 as a buried collector of the NPN transistor 45 is formed in a deeper position than the buried layer 34 as the device isolation layer. Accordingly, in order to reduce the parasitic capacitance at the buried layer 12, the buried layer 42 located deeper than the buried layer 43 and not coming into contact with the buried layer 12 is provided separately from the buried layer 43. However, in case the buried layer 12 is not located deeper than the buried layer 34, the buried layer 43 may be provided on all sides without the buried layer 42 provided.

In the semiconductor device according to the present invention, the number of carriers generated inside the depletion layer in the PN junction of a photodetector is increased, and the number of carriers reaching the depletion layer by the diffusion of the carriers generated outside the depletion layer is increased, which enhances the photoelectric conversion sensitivity of the photodetector. Moreover, the parasitic capacitance in the PN junction of the photodetector is reduced, and the parasitic resistance at one electrode of the photodetector is lowered, which produces an excellent frequency characteristic.

Further, in case the third through fifth semiconductor regions occlude the side and bottom of the device active region, the number of carriers generated inside the depletion layer in the PN junction of the photodetector is further increased, and the number of carriers reaching the depletion layer by the diffusion of the carriers generated outside the depletion layer is further increased, which further enhances the photoelectric conversion sensitivity of the photodetector.

Moreover, since the parasitic capacitance in the PN junction of the photodetector is further decreased, the frequency characteristic of the photodetector is further enhanced. Besides, a deep device active region is secured, which gives a high flexibility for forming devices in this device active region.

Furthermore, if a bipolar device is formed in the device active region and a buried collector is provided inside the device active region, the parasitic capacitance in the buried collector can be reduced, which produces a high speed bipolar device.

In the method of manufacturing a semiconductor device according to the invention, the third semiconductor region is formed in a region inside of the first semiconductor region that is not depleted by a reverse voltage applied to the PN junction of a photodetector. However, since the third semiconductor region can easily be formed in a desired depth inside of the first semiconductor region, it is possible to manufacture in a low cost a semiconductor device including a photodetector that has a high photoelectric conversion sensitivity and an excellent frequency characteristic.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a semiconductor device including a photodetector having a PN junction comprising:

a first step for forming a buried layer (33, 43) of a first conductivity type (p-type) that is completely buried inside a first conductivity type substrate by an ion-implantation process;

a second step for forming an epitaxial layer (14) of a first conductivity type on said substrate;

a third step for forming a diffusion layer (19) of a second conductivity type in said epitaxial layer;

wherein said buried layer and a portion of said substrate formed between said buried layer and said epitaxial layer constitute one electrode of said photodetector, and wherein said epitaxial layer and said diffusion layer constitute another electrode of said photodetector.

2. A method of manufacturing a semiconductor device as claimed in claim 1, further comprising a fourth step for forming a second buried layer (34) of the first conductivity type and being connected to said buried layer, between said first step and said second step.

3. A method of manufacturing a semiconductor device as claimed in claim 2, further comprising the step of forming a second diffusion layer (15) connected to said second buried layer (34), after said second step.

4. A method of manufacturing a semiconductor device as claimed in claim 1, further comprising the step of forming a third buried layer (12) of second conductivity type which constitutes a collector region of a bipolar transistor between said first step and said second step.

5. A method of manufacturing a semiconductor device as claimed in claim 4, further comprising the step of forming a third diffusion layer (16) connected to a base region (17) and an emitter region after said second step.

6. A method of manufacturing a semiconductor device as claimed in claim 2, further comprising the step of forming a third diffusion layer (16) connected to a base region (17) and an emitter region after said second step.

7. A method of manufacturing a semiconductor device as claimed in claim 3, further comprising the step of forming a third buried layer (12) of a second conductivity type which constitutes a collector region of a bipolar transistor, between said first step and said second step.

8. A method of manufacturing a semiconductor device as claimed in claim 7, further comprising the step of forming a third diffusion layer (16) connected to said third buried layer, a base region (17) and an emitter region, after said second step.

9. A method of manufacturing a semiconductor device as claimed in claim 4, wherein said third buried layer (12) of the second conductivity type is deeper than a second buried layer (34).

10. A method of manufacturing a semiconductor device as claimed in claim 4, further comprising the step of forming a fourth buried layer (42) of the first conductivity type, which is connected to the buried layer (43).

11. A method of manufacturing a semiconductor device as claimed in claim 10, wherein said fourth buried layer is deeper than the buried layer.

* * * * *